United States Patent
Francisquini

(10) Patent No.: US 10,447,016 B2
(45) Date of Patent: Oct. 15, 2019

(54) SAFETY DEVICE FOR THE LOCKING AND ACTUATION OF ELECTRICAL CONNECTORS PROVIDED IN EXTRACTABLE DRAWER FOR MCC CABINET

(71) Applicant: Melquisedec Francisquini, São Paulo II (BR)

(72) Inventor: Melquisedec Francisquini, São Paulo II (BR)

( * ) Notice: Subject to any disclaimer, the term of this patent is extended or adjusted under 35 U.S.C. 154(b) by 0 days.

(21) Appl. No.: 15/129,995

(22) PCT Filed: Mar. 26, 2015

(86) PCT No.: PCT/BR2015/000043
§ 371 (c)(1),
(2) Date: Dec. 28, 2017

(87) PCT Pub. No.: WO2015/143521
PCT Pub. Date: Oct. 1, 2015

(65) Prior Publication Data
US 2018/0219359 A1 Aug. 2, 2018

(30) Foreign Application Priority Data
Mar. 28, 2014 (BR) .................. 10 2014 0075623

(51) Int. Cl.
*H02B 1/36* (2006.01)
*H02B 11/133* (2006.01)
(Continued)

(52) U.S. Cl.
CPC ............. *H02B 1/36* (2013.01); *H02B 1/21* (2013.01); *H02B 11/173* (2013.01);
(Continued)

(58) Field of Classification Search
CPC ...... H02B 1/36; H02B 11/133; H02B 11/173; H02B 1/21; H02B 11/127; H05K 7/1417
(Continued)

(56) References Cited

U.S. PATENT DOCUMENTS 3,193,633 A * 7/1965 Netzel .................... H02B 1/36
200/50.21
3,573,559 A * 4/1971 Rogers ................. H02B 11/26
200/50.21

(Continued)

FOREIGN PATENT DOCUMENTS

AU 2002252966 B2 2/2005
BR 0306929 A 4/2006
(Continued)

OTHER PUBLICATIONS

International Search Report PCT/BR2015/000043; International Filing Date: Mar. 26, 2015; 3 pgs.
(Continued)

*Primary Examiner* — Anatoly Vortman
(74) *Attorney, Agent, or Firm* — Schmeiser, Olsen & Watts, LLP

(57) ABSTRACT

A safety device developed to promote more security and better efficiency in its use is provided to operate in the locking and actuation of electrical connectors positioned in extractable drawers for MCC cabinets, thereby setting a safety device capable of connecting or disconnecting the internal connectors, both principal and test connector, provided in the extractable drawer for MCC cabinet, the procedure is executed mechanically through an assembly of elements that interconnect two thin laminar plates and, these in turn, interconnected to each other, positioned inferiorly and of conformations corresponding to promote a perfect fit.

24 Claims, 7 Drawing Sheets

(51) Int. Cl.
*H02B 1/21* (2006.01)
*H02B 11/173* (2006.01)
*H05K 7/14* (2006.01)
*H02B 11/127* (2006.01)

(52) U.S. Cl.
CPC .......... *H05K 7/1417* (2013.01); *H02B 11/127* (2013.01); *H02B 11/133* (2013.01)

(58) Field of Classification Search
USPC ....................................................... 361/608
See application file for complete search history.

(56) References Cited

U.S. PATENT DOCUMENTS

| | | | | |
|---|---|---|---|---|
| 4,002,865 | A * | 1/1977 | Kuhn | H02B 11/133 200/50.22 |
| 6,563,062 | B2 * | 5/2003 | Kurano | H02B 11/127 200/308 |
| 7,688,572 | B2 * | 3/2010 | Yee | H02B 1/36 200/50.08 |
| 7,726,751 | B2 * | 6/2010 | Bergmann | E05B 65/02 312/222 |
| 8,283,585 | B2 * | 10/2012 | Capelli | H02B 11/28 200/50.23 |
| 8,288,669 | B2 * | 10/2012 | Capelli | H02B 11/127 200/50.24 |
| 8,638,561 | B2 * | 1/2014 | Lehtola | H05K 7/1409 361/724 |
| 9,252,534 | B2 * | 2/2016 | Richards | H01R 13/62933 |
| 9,831,645 | B2 * | 11/2017 | Espinosa Gutierrez | ........... H02B 1/36 |
| 2008/0094782 | A1 * | 4/2008 | Mason | H02B 11/127 361/609 |
| 2008/0144258 | A1 | 6/2008 | Mathes et al. | |

FOREIGN PATENT DOCUMENTS

| | | |
|---|---|---|
| BR | MU8402713 U | 6/2006 |
| BR | PI0700143-6 | 1/2007 |
| BR | MU8900420 U2 | 4/2011 |
| BR | PI1003845 A2 | 2/2013 |
| CN | 2406397 Y * | 11/2000 |
| CN | 2408598 Y * | 11/2000 |
| DE | 19504474 A1 | 8/1996 |
| DE | 102008046881 A1 | 3/2010 |
| EP | 1227557 A1 | 7/2002 |
| FR | 2126117 A1 | 10/1972 |
| JP | 2012060806 A | 3/2012 |
| KR | 100831290 B1 | 5/2008 |
| WO | WO-2008122533 A1 * | 10/2008 ............... H02B 1/36 |

OTHER PUBLICATIONS

Written Opinion PCT/BR2015/000043; International Filing Date: Mar. 26, 2015; 8 pgs.

* cited by examiner

SAFETY DEVICE FOR THE LOCKING AND ACTUATION OF ELECTRICAL CONNECTORS PROVIDED IN EXTRACTABLE DRAWER FOR MCC CABINET

TECHNICAL FIELD

The present specification is related to a device notably developed to promote improved security and better efficiency in its use, i.e., in locking and actuating of electrical connectors provided in an extractable drawers of an MCC cabinet, thereby setting a safety device capable of connecting or disconnecting the internal connectors, both main and test connector, provided in the extractable drawer of an MCC cabinet, said procedure is executed mechanically through an assembly of elements that interconnect two thin laminar plates, to each other, which are positioned inside the body of the drawer and configured to promote a perfect fit.

The safety device for locking and actuating electrical connectors is provided in an extractable drawer of an MCC cabinet, particularly relates to the field of safety devices for the actuating and/or locking electrical equipment, wherein said device operates while the door is closed, promoting protection of the operators of the extractable drawers in an MCC cabinet

PRIOR ART

As known by the professionals of the industry and commerce of electrical equipment, particularly electrical cabinets MCC-type (Motor Control Center), the referenced MCC cabinets comprise a handling and load control system, containing electrical motors having low or middle voltage.

MCC cabinets are currently divided into sections to accommodate equipment for protection, sectioning, and handling of loads, which present important functions in the distribution systems of electric power in commercial and industrial units. Exactly where the cables from the loads are connected.

Although most of the industrial loads are formed by motors, the term "loads" is quite general and can mean any equipment that consumes electrical energy, such as greenhouses, resistors and other correlated equipment used in industrial installations containing a plurality of loads, where said loads must be in continuous operation, and where access is required by unskilled personnel and further where a high level of safety is required for equipment operators and maintenance personnel.

The MCC cabinets are made of a metallic material, which for example may be, self-sustained, simplified or armored, and may be a Totally Tested Assembly (TTA) or a Partially Totally Tested Assembly (PTTA).

In the TTA concept, the performance is assured by tests carried out individually on the plurality of components (bus, inputs, outputs, feeders, motor starters, etc.) or by tests performed on the completed assembly.

These tests have the purpose of ensuring the performance of the assembly and minimizing the risks due to errors in the projects.

On the other hand, in PTTA-type, only some components are tried and tested.

Therefore, the referred cabinets are formed by drawers which can be fixed or extractable.

The extractable drawers are specific to ensure safety in operation and for fast maintenance, mainly in case of replacement during operation.

The MCC cabinets are designed with a high standardization index, facilitating assembly, installation and maintenance, while allowing expansions and interchangeability between drawers of the same MCC model having the same dimensions and functions.

The MCC cabinets present mechanical and electrical interlocking functions, protection against contact with living parts, total interlocking of contactors, metal divisions preventing arc propagation; along with providing safety for personnel, operation and maintenance.

At the beginning, the cabinets of the MCC-type were not compartmentalized, i.e., they were provided with a single mounting plate, where the protection assemblies and the handling of individual loads were mounted together in this same plate; solution known as a conventional electrical cabinet.

On the other hand, in the compartmentalized MCC cabinets, the safety equipment and handling of each load are mounted in isolated compartments within the same panel. This MCC can be fixed or extractable.

In the fixed MCC, particularly inside each compartment is a fixed mounting plate, where the equipment for safety and handling of starts is positioned.

Meanwhile, in the extractable MCC, particularly inside each compartment is mounted a drawer, which can be removed from the panel without the assistance of tools, such as levers or cranks; a common means of extraction for a long period of time.

The equipment for safety and handling of starts is mounted inside the drawers, minimizing the downtime, because it is possible to quickly replace the drawers.

The MCCs are essential assemblies for the production, and with the advancement of technology and the need for monitoring and controlling of production, the use of networks is a solution that enables reduced downtime from hours to minutes, with a better and more complete diagnostics, by means of supervisory systems that locate accurately the problematic points during the production process, making it possible to know what and where to intervene and correct.

The prior art provides some models of extractable drawers for MCCs, wherein each one is provided with a mean other than extraction and reinsertion in the MCC, in addition to, locking and actuating of the electrical connectors, for handling means.

After a brief search in the world patent banks, several relevant documents were found, among which is PI 0700143-6 filed on Apr. 1, 2007, under the title, "SLIDING CONNECTION DEVICE OF EXTRACTABLE DRAWER IN ELECTRICAL PANEL", which refers to a sliding connection device for connecting a extractable drawer to a bus bar of main power of an electrical panel, comprising a section fixed to the drawer and a sliding section associated to said fixed section. The fixed section is provided with terminals to which the power cables are connected, and the sliding section is provided with electrical contacts for connecting to the power bus bar, and between said fixed section and said sliding section is arranged at least one movement course in the form of a groove and at least one intermediate contact performing the physical and electrical connection between said sections.

Thus, from this course the device is capable of moving for coupling or uncoupling to the power bus bar in such a way that only the sliding section performs this movement, while the fixed section and the power cables associated to it, remain immovable.

Further documents are described below, namely, DE102008046881, DE19504474 and FR2126117.

The document DE102008046881, filed on 18 Mar. 2010, provides a module that has a locking unit and a contact switch unit with multiple contact switches, where the contact switches are operated by the locking unit, and where the locking unit and the contact switches are arranged in upper housings or on a housing carrier.

Two actuation components in the form of key holders are provided in the locking unit, being the module movable between a separating position and an operating position by the actuation components.

The contact switches are in contact with the bus bars in the operating position.

The second document, DE19509474, filed on 19 Sep. 1996, discloses a switching device that provides a number of shelves for holding bus bars coupled to the drawers, wherein for each bus bar there are contact sliders, and each of these has a rigid contact rail.

There is still a mechanism to bring the rack into contact or withdraw it, and the contact sliders and rails are on the back side of the rack.

All the contacts of one rack are operated by the same mechanism, this being on the front side of the rack.

The contact sliders have grooves at right angles to the sliding direction in which a comb-like coupling element sits, joined to the operating mechanism and, finally, each contact slider has two spring contacts, between which the bus bar fits.

The third document, FR2126117, filed on 26 Feb. 1971, relates to the embodiment of a mechanical coupling system for a locking position of two objects, and afterwards its release or disengagement, being this effect possible due to the use of two appropriate levers, where its commands can be simultaneous or not, and may be even used in junction of connectors, drawers, cabinets, power modules, etc.

The prior art further discloses the document AU2002252966, filed on 17 Feb. 2005, which refers to a low voltage switchgear comprising an appliance module for receiving appliances according to the switching, control and protection technology. A locking bar comprising laterally projecting bolts is arranged in a housing of the appliance module, perpendicularly in relation to the direction of displacement.

Positioning cranks are arranged on lateral edges of the bottom of a section, the bolts co-operating with said positioning cranks in order to lock the appliance module in an operating, separating and test position.

A lifting gear is used to lift the locking rod in its working position, said lifting gear being actuated by means of a control unit which is arranged on an operating face.

The test position is brought about if an auxiliary separating contact is locked in the separating position of the appliance module.

Another document is U.S. Pat. No. 7,791,862, filed on 19 Jun. 2008 and refers to an electrical switching system comprises a housing and the components which are arranged therein and which are embodied as a control and/or measuring unit.

Said components are arranged in modular-type drawers.

At least one base module comprises at least one module support profile, in addition to lateral walls and front sided insertion elements.

One front wall of the base module, preferably the front side thereof, is formed by a control unit and the opposite front wall thereof the measuring unit, and the dimensions of the control and measuring unit are adapted to the size of the module.

Nevertheless, the most modern and used type of extractable drawer in the prior art is still to be mentioned herein, and is configured by a type of extractable drawer equipped with a safety system which has two actuating and locking keys, a smaller key that actuates the connectors of the test command and a larger key capable of actuating connectors of the power input of the system, i.e., coupling the connectors to the bus bars, and actuating all of the equipment connected therein.

First, it is worth mentioning that in this type of extractable drawer, the procedure that the operator uses to verify the functioning conditions of the system takes place from the actuation or rotation of the lower command, which is confirmed by a special short key, which mechanically actuates the test device of the system.

After verifying the conditions of the equipment that will be actuated, the operator rotates the smaller key in reverse, de-energizing the test device of the system.

Next, after withdrawing the smaller key, a longer key is inserted into the same hole, actuating by rotation, the equipment itself, the actuation is executed by a mechanical device comprised of a plurality of rods, turnstiles and joints, which connect the actuating means of the equipment, pressing the clutches of the extractable drawer, and connecting them to the bus bars that energize the equipment.

The device described above is the most modernly used device by the consumer public. However, the referred device also presents some drawbacks among which is the use of two keys for the actuation of the test and operation of the equipment itself.

Another important drawback is the number of components used, so that the device has full operation, where the fatigue or failure of any of the component elements of this device, may cause the malfunction and/or the total locking of the aforementioned safety device.

BRIEF DESCRIPTION OF THE INVENTION

Thinking about the existing drawbacks and in order to promote greater safety and protection to the operators of electrical MCC cabinets, simplification in the use and reduction of the manufacturing costs, the inventor, after extensive research has created and developed this "SAFETY DEVICE FOR LOCKING AND ACTUATING ELECTRICAL CONNECTORS PROVIDED IN EXTRACTABLE DRAWER FOR MCC", which should be positioned with total distinction and be customized before the consumer market by the fact of presenting a device developed to promote an improved safety in its use, i.e., the locking and actuating of electrical connectors provided in extractable drawers of an MCC cabinet, thereby setting a safety device capable of connecting or disconnecting the internal connectors along with their respective bus bars, both the main connector and the test connector, arranged in a extractable drawer of an MCC cabinet, said procedure is executed mechanically through an assembly of elements that interconnect two thin laminar plates each other, which are positioned inside the body of the drawer and configured to promote a perfect fit.

The mechanical movement of the elements of this assembly takes place externally with the door closed, from the movement of a main key which actuates a pendulum, this being passible of moving an assembly of gears suitably arranged in the extractable drawer of MCC, which in turn moves the lower laminar plates, connecting the test device and the connectors, which when in contact with their corresponding bus bars, energize the equipment in which they are connected to.

BRIEF DESCRIPTION OF THE DRAWINGS

The subject matter of this invention will become fully clear in its technical aspects from the detailed description that will be performed based on the figures listed below, wherein.

DETAILED DESCRIPTION OF THE INVENTION

Figure 1:
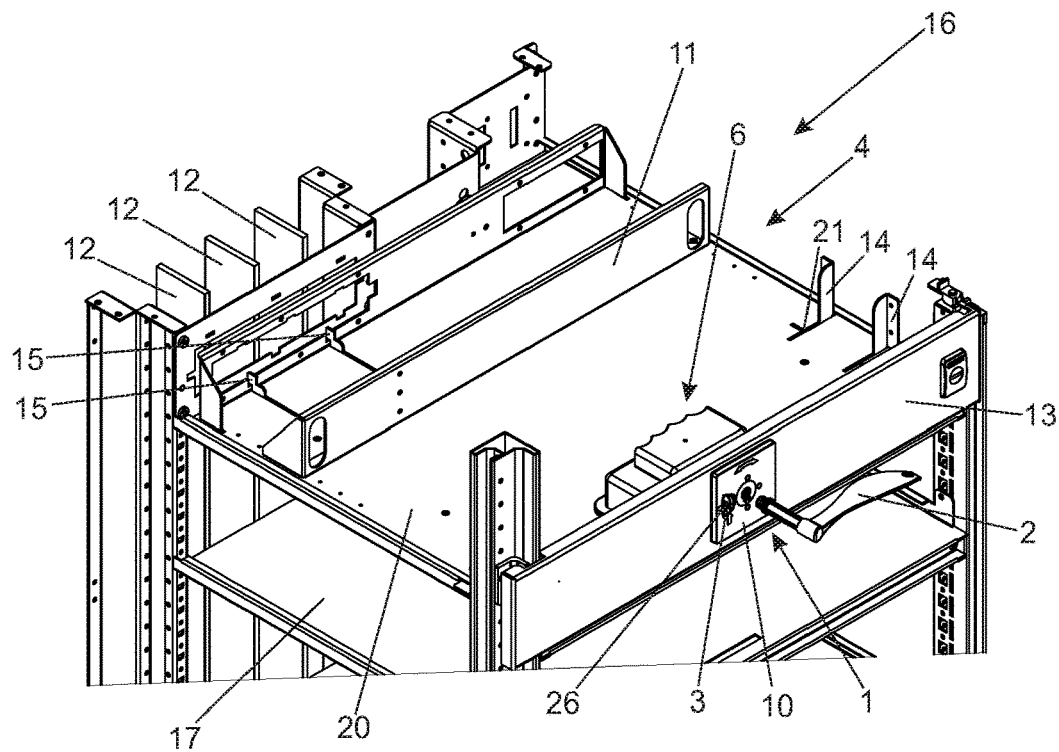
FIG. 1 shows a top view, in perspective, of an extractable drawer of an MCC cabinet, illustrating the door of the drawer, the safety device, the gear case and transmission elements of the movements that interconnect the connectors and the bus bars.
Figure 2:
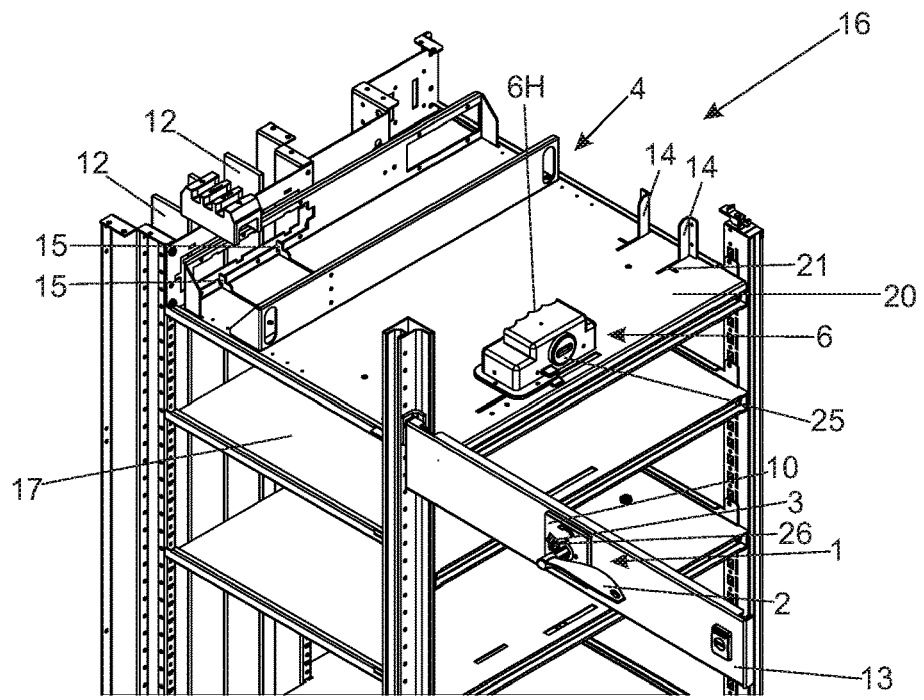
FIG. 2 shows a top view, in perspective of an extractable drawer of an MCC cabinet, illustrating the door of the drawer opened, showing the autonomous safety device coupled to the door, the gear case and transmission elements of the movements that interconnect the connectors and the bus bars.
Figure 3:
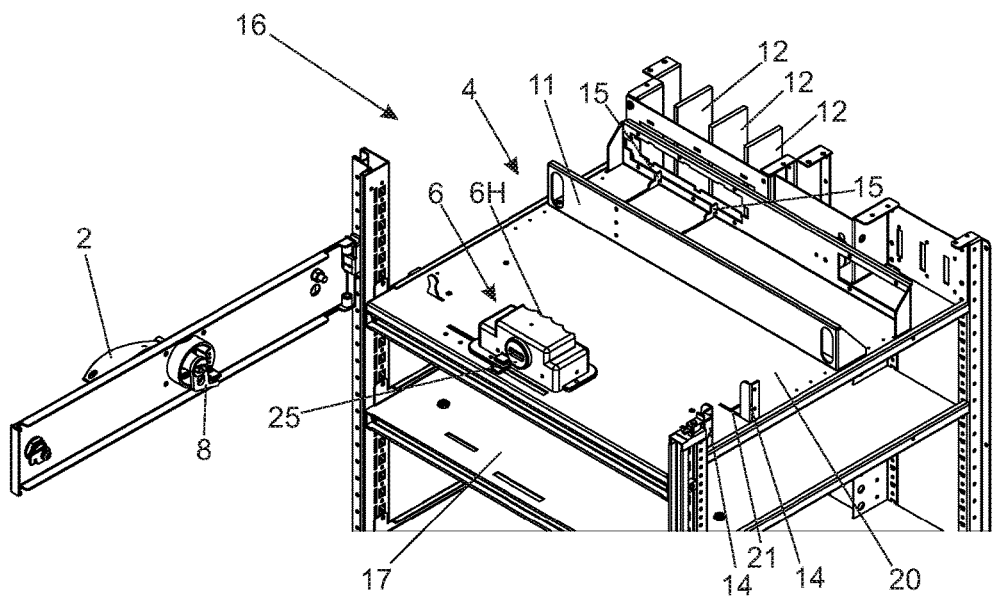
FIG. 3 shows a top view, in perspective, of an extractable drawer of an MCC cabinet, illustrating the door of the drawer opened, showing the back face of the autonomous safety device coupled to the door, the gear case and the orthogonal laminar tabs of the transmission elements of the movements that interconnect the connectors and the bus bars.
Figure 4:
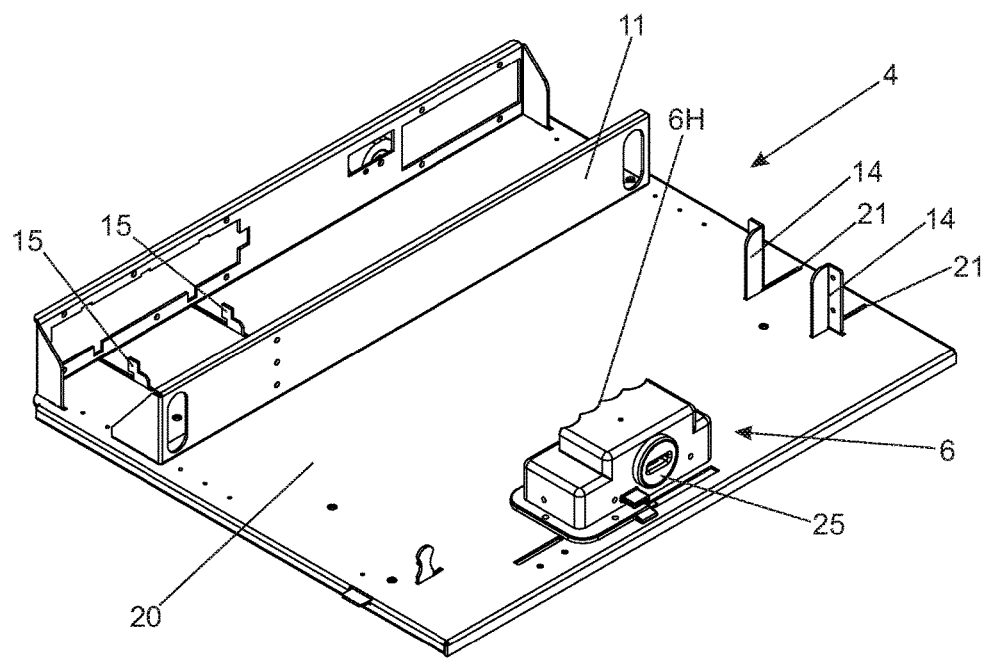
FIG. 4 shows a top view, in perspective, of an extractable drawer of an MCC cabinet, illustrating the gear case and the orthogonal laminar tabs of the transmission elements of the movements that interconnect the connectors and the bus bars.
Figure 5:
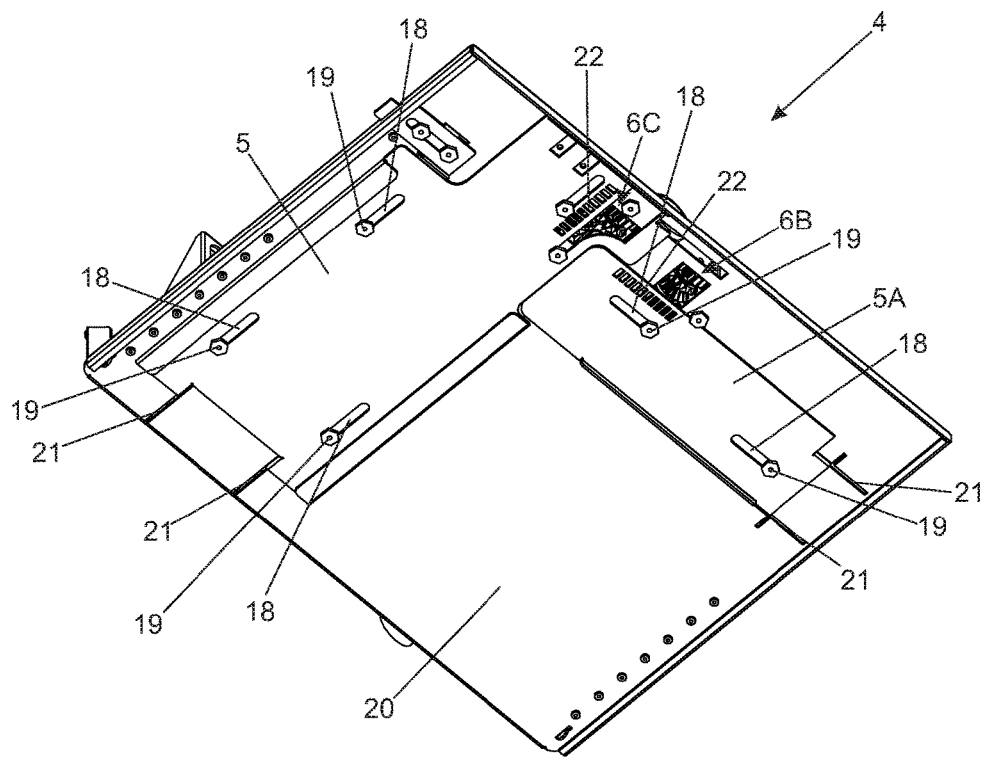
FIG. 5 shows a bottom view, in perspective, of an extractable drawer of an MCC cabinet, illustrating the gear case and the transmission elements of the movements that interconnect the connectors and the bus bars, mechanically protected.
Figure 6:
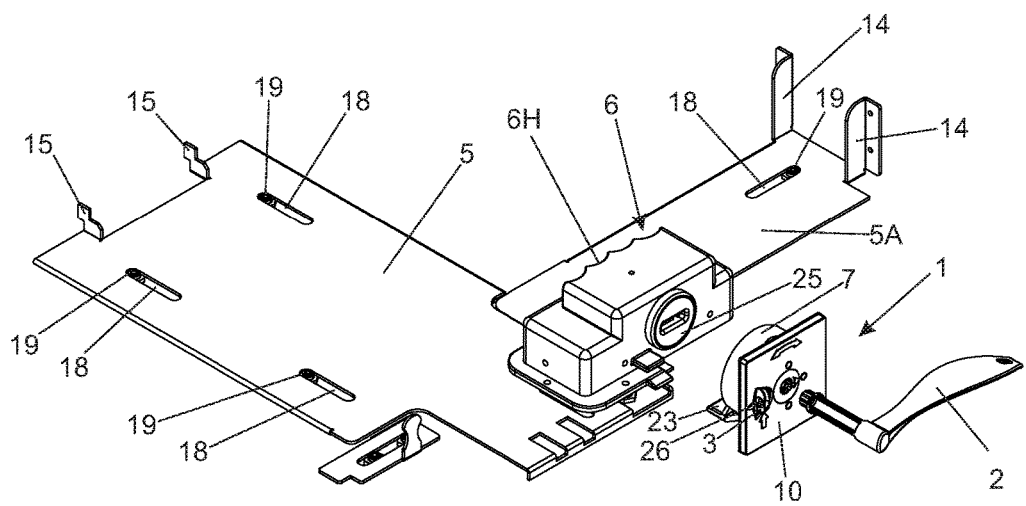
FIG. 6 shows a top view, in perspective, of the safety device, the gear case and the laminar plates provided with orthogonal tabs for transmission of the movements that interconnect the connectors and the bus bars.
Figure 7:
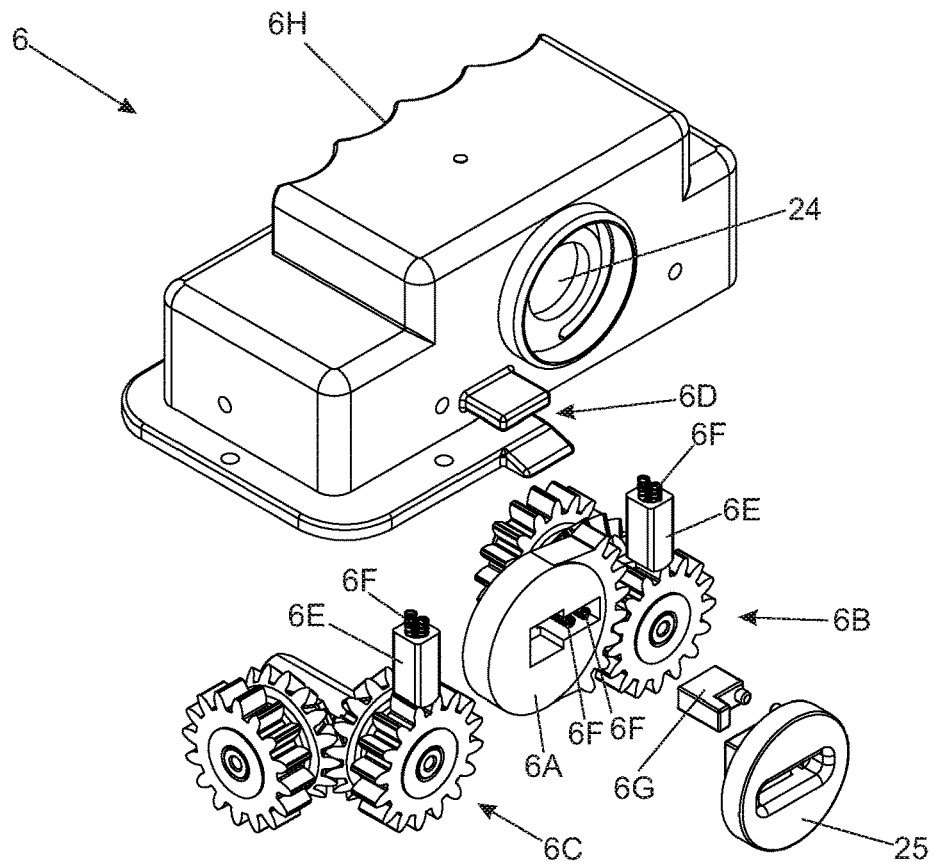
FIG. 7 shows a front view, in perspective and exploded, of the gear case, showing each assembly of internal gears.
Figure 8:
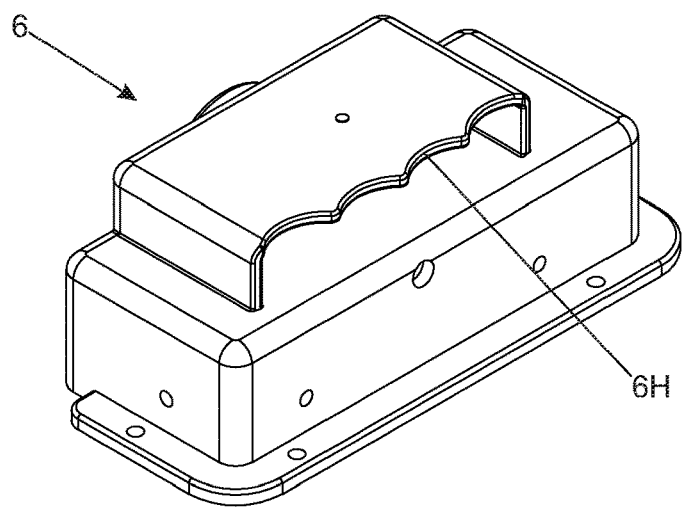
FIG. 8 shows a rear top view, in perspective, of the gear box.
Figure 9:
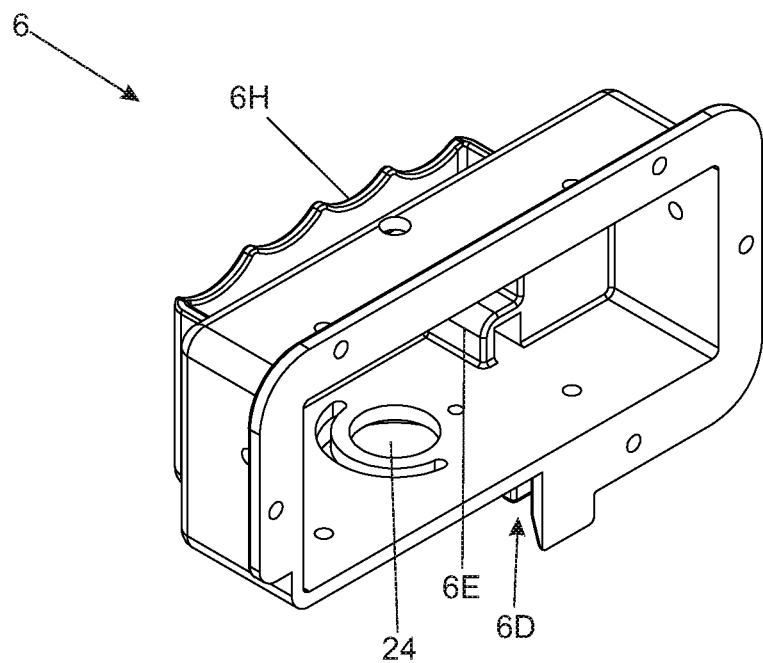
FIG. 9 shows a bottom view, in perspective, of the gear case.
Figure 10:
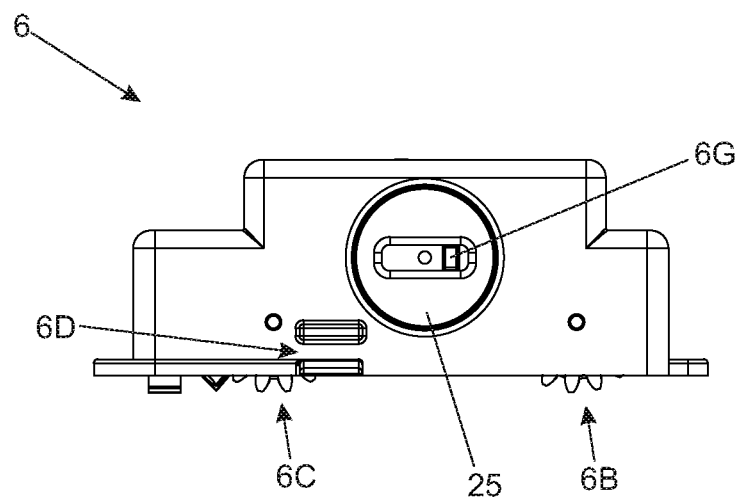
FIG. 10 shows a front view of the gear case.
Figure 11:
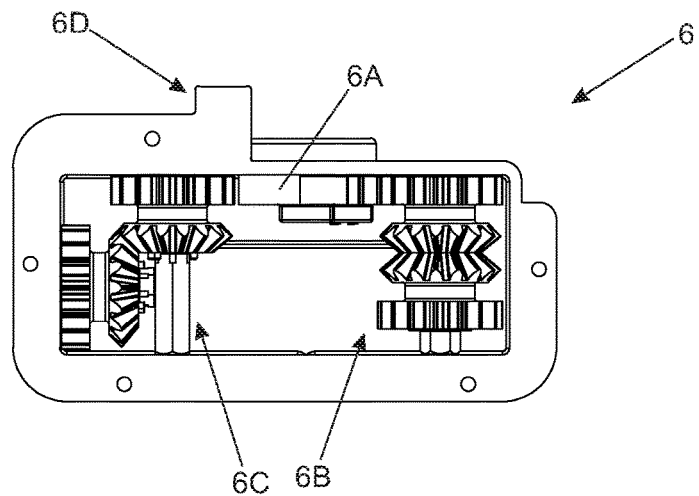
FIG. 11 shows a bottom view, in perspective, of the gear case.
Figure 12:
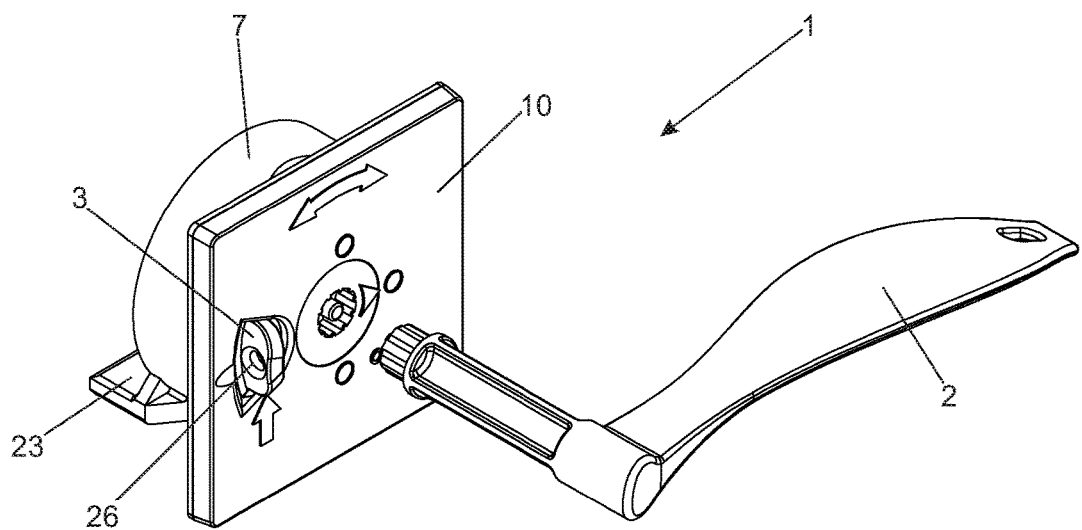
FIG. 12 shows a perspective view of the door lock assembly of the extractable drawer of an MCC cabinet.
Figure 13:
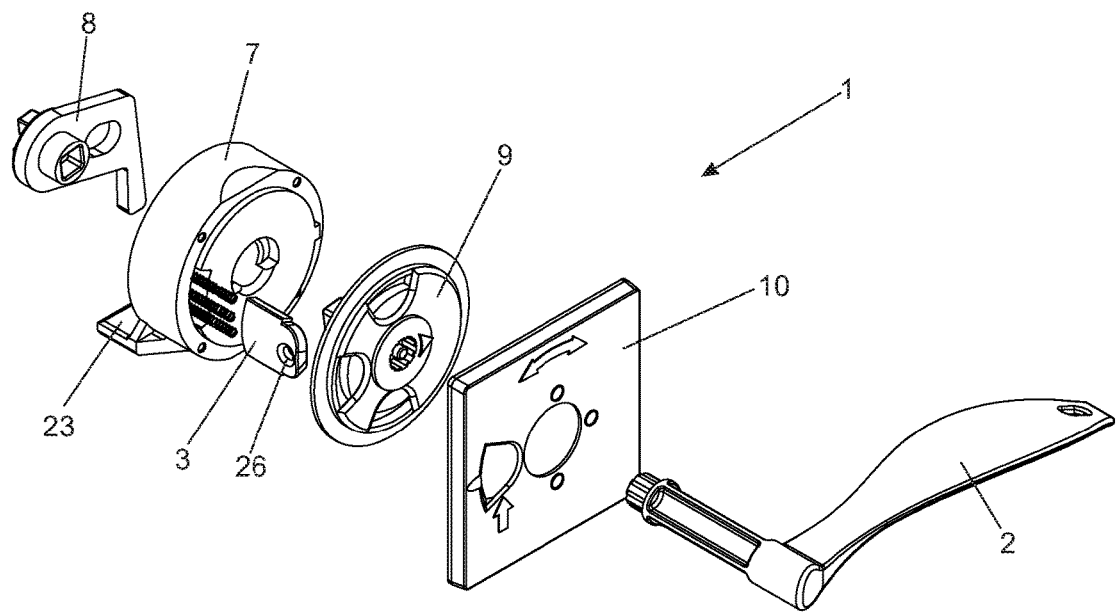
FIG. 13 shows a perspective exploded view of the door lock assembly of the extractable drawer door of an MCC cabinet.

In accordance with the aforementioned illustrated figures, the present invention "SAFETY DEVICE FOR LOCKING AND ACTUATING ELECTRICAL CONNECTORS PROVIDED IN EXTRACTABLE DRAWER FOR MCC" refers more particularly to a safety device 1 notably developed to promote the connection and disconnection of the internal connectors of the bus bars 12 that connect them, both the main power connector that actuates the main equipment as the test connector, arranged in the extractable drawer 4 of an MCC cabinet 16 with mechanical movement of the elements provided in the safety device 1, which takes place externally while the door closed, from the movement a special actuation key 2 that is provided with an autonomous safety device and in turn actuates a pendulum, that moves the assembly of gears 6 suitably arranged in the front section of the extractable drawer 4 of an MCC 16, immediately behind the safety device 1, wherein said device 1 actuates the gear box 6, which in turn moves the lower laminar plates 5 and 5a actuating the test connector and subsequently the main connectors, being that said main connectors when in contact with their corresponding bus bars 12, energize the equipment in which they are connected to.

The laminar plates 5 and 5a are strategically positioned on the lower face of the extractable drawer 4 of an MCC cabinet 16, wherein the laminar plates 5 and 5a have a plurality of small oblong 18 cutouts mated to small guide pins 19 which are arranged in the base 20 of the extractable drawer 4, which is formed in a single piece, said guide pins 19 delimiting the movement of the plates 5 and 5a.

Furthermore, said plates 5 and 5a provide at least two small laminar tabs 14, i.e. orthogonal extensions of the plates 5 and 5a, wherein said tabs 14 are orthogonal to the plane of the plates 5 and 5a, and wherein said tabs 14 are inserted into the guide 21 cutouts, pressing the connectors provided on the extractable drawer 4 towards their corresponding bus bars 12.

The laminar plates 5 and 5a also contain a plurality of small rectangular 22 cutouts aligned with each other and capable of receiving the gear teeth provided in the housing 6, by moving the laminar plates 5 and 5a to connect or disconnect the connectors of the bus bars 12.

As stated above, the procedure is performed mechanically through at least one gear assembly 6 which connects the safety device 1 to the two lower, and thin, laminar plates 5 and 5a. Said laminar plates 5 and 5a are connected to each other, positioned inferiorly and are of corresponding configurations, with the main plate 5 being larger, said main plate 5 moves the connectors towards the bus bars 12, that fit therein, thus energizing the entire system. Prior to movement of the main plate 5, the laminar plate 5a, i.e. the smaller plate, is actuated in turn performing a functioning test for the operation of the main equipment to be released for use.

The test device is actuated on the first movement of the actuating and locking key 2 of the extractable drawer 4, wherein the locking device is suppressed, without which the actuation key 2 does not rotate, connecting the test device in said extractable drawer 4 and verifying the proper functioning of the system as a whole.

Subsequent to actuating this test device, through a new movement of the actuating and locking key 2 of the system, along with a new actuation of the locking device 3, it is possible to actuate the main connectors, energizing all the equipment connected therein.

The same reverse procedure occurs at system shutdown, when the key 2 should move conversely.

Thus, said safety device 1 allows for the actuation of the system only in a secure environment, i.e., actuation of the main equipment occurs only sequentially by means of a key 2, which first actuates the test device through said special key 2 so that, posteriorly, the main equipment can be actuated, such that in the event of any malfunction found in the equipment, whether electrical or mechanical, the first connector designed for testing, is passible to receiving an electric charge substantially lower than the main connector, minimizing or even eliminating inconveniences arising from malfunctions in the electrical system or the equipment thereof.

The test connector of the system functioning is released, primarily through key 2 that actuates the connectors of the test command and, then, the entire system is released through the same key 2, actuating the main connectors in the bus bars 12 of the electrical system of the equipment coupled to the MCC 16, turning on all the equipment, being that the two steps, the actuation of the test device and the actuation of the main connectors, occur in the front of the extractable drawer 4 while locked in the "closed" position.

The unlocking of the extractable drawer 4 occurs in the actuation of the test command and in the same sequence, the main connection command of the bus bars 12 of the system is actuated simultaneously locking the front of the extractable drawer 4.

To better illustrate the functioning steps of this assembly, the following is a table showing the steps of movement and connection of the bus bars of the extractable drawer.

the compartment empty, due to the operating system of the extractable drawer 4 coupled to the door.

The positioner presents a specific encoding and has been developed for different types of extractable drawers 4.

On the other hand, the modular socket of command and the lateral or back network provides flexibility for the use of different types of connectors, such as PROFIBUS, ETHERNET or for the output of power up to 100 A, etc.

The working mechanism of the extractable drawer 4 occurs through oriented gears and works sequentially through mechanical interlocks.

In this way, in order to access the interior of the extractable drawer 4, making it possible to turn on or off the equipment connected to the MCC 16, to perform maintenance, among others, first, the key 2 is inserted, putting the system into test mode, thus turning on the test command, capable of occurring with the door opened or closed, optionally only with the door closed.

Subsequently, the connection key 2 of the main equipment is actuated, remembering that the actuation of the system

TABLE 1

| PHASE | PROCEEDING | FUNTION | OBS |
|---|---|---|---|
| 1° | PRESS THE LOCKING DEVICE 3 AND DO THE FIRST ROTATION OF THE SPECIAL ACTUATION KEY 2, MOVING THE FIRST SMALL LAMINAR PLATE 5A, WHICH IS RESPONSIBLE FOR THE CONNECTION OR DISCONNECTION OF THE TESTSOCKET | CONNECT THE TEST SOCKET, BLOCKING AUTOMATICALLY THE ADVANCE TO THE NEXT STEP | THE DOOR 13 OF THE EXTRACTABLE DRAWER 4 IS CLOSED AND LOCKED, PASSIBLE OF BEING OR NOT OPENED BY MEANS OF THE MOUNTING CONDITION SELECTED |
| 2° | PRESS THE LOCKING DEVICE 3 AND DO THE SECOND ROTATION (SEQUENTIAL), MOVING THE SECOND LARGE LAMINAR PLATE 5, WHICH IS RESPONSIBLE FOR THE CONNECTION OR DISCONNECTION OF THE POWER SOCKET | CONNECT THE POWER SOCKET FOR THE CONNECTION OF THE BUSBARS, BLOCKING AUTOMATICALLY THE ADVANCE TO THE NEXT STEP | THE DOOR 13 OF THE EXTRACTABLE DRAWER 4 IS CLOSED AND LOCKED, UNABLE TO BE OPENED IN THIS CONDITION (ENERGIZED) |
| 3° | PRESS THE LOCKING DEVICE 3 AND DO THE SECOND INVERTED ROTATION | DISCONNECT THE POWER SOCKET, DISCONNECTING THE BUSBARS AND BLOCKING AUTOMATICALLY THE ADVANCE TO THE NEXT STEP | THE DOOR 13 OF THE EXTRACTABLE DRAWER 4 IS CLOSED, PASSIBLE OF BEING OPENED |
| 4° | PRESS THE LOCKING DEVICE 3 AND DO THE FIRST INVERTED ROTATION (SEQUENTIAL) | DISCONNECT THE TEST SOCKET, BLOCKING AUTOMATICALLY THE ADVANCE TO THE NEXT STEP | THE DOOR 13 OF THE EXTRACTABLE DRAWER 4 IS CLOSED, PASSIBLE OF BEING OPENED |

More specifically, the safety device 1 for locking and actuating the electrical connectors arranged the extractable drawer 4 for MCC Cabinet, presents a degree of protection IP40 to IP55 and their compartmentalization forms up to 4B, in accordance with the NR10 requirements.

The sealing and locking of the drawer 4 through a padlock or other equivalent locking mechanism is also possible with through the key 2 only occurs if the test command is connected and the door of the extractable drawer 4 is closed. Thus, there will be no movement of the connecting cables and the door will be automatically locked.

Then, the key 2 is returned to the test position, turning off the power input, at this stage the door must be closed, releasing the locks of the both the door and the test command.

Finally, it returns to the "disconnected" position by turning off the command, said operation is possible only and exclusively if the power input is disconnected.

The extractable drawer 4 also provides a mounting plate of components 11, positioned transversally.

The power transmission assembly and the mechanical lock assembly are comprised of a safety device 1, an assembly of gears 6 and finally by an assembly of plates 5 and 5a provided with elements that connect to the connectors for actuating and locking of the assembly next to the bus bars 12.

The safety device 1 is positioned in the door 13 of the extractable drawer 4 and is formed by a frame 10 for fixing and finishing of the safety device 1, opposite of which is positioned a drive bushing 9, this in turn, is fitted axially in a body 7 of the safety device 1 which contains a guide tab 23 and, fitted in the back section of this body is positioned a coupling tab 8 for the actuation of the drawer and the safety lock.

On the other hand, the gear case 6 interconnected to the lock assembly, contains internally, a central pendulous element 6a flanked by at least one assembly of gears 6b, 6c, passible of actuating the connection point 14 for the test device, or still, actuating the connection point of the power input 15 or both.

Internal additional elements of the gear case 6 are spring elements 6f that permit the full functioning of said elements, being that each of the gear case 6 assemblies contain a housing 6e in which said spring elements 6f are positioned.

The back face of the gear case 6 contains an ergonomic section 6h notably developed to receive the fingers of the operator, allowing for the manual movement of the extractable drawer 4 when required.

The front face of the gear case 6 contains two small guide tabs parallel to each other, positioned vertically, between said tabs is an opening for the third tab i.e. the guide tab 23, of the back section of the body 7 of the safety device 1, which is positioned in the back section of the lock assembly, fitting between the tabs 6d of the gear case 6, said device is designed to maintain interlocking of the entire safety device 1 and gear case 6.

Furthermore, the front face of the gear case 6 contains a central hole 24, which houses a switch 25 that receives the end of a special key 2 for actuation of the system, wherein said key 2 contains a small salience that presses a small button 6g built into said switch 25, which when pressed by the salience of the end of the special key 2, allows, in conjunction with the pressing of the locking device 3, or the external button for safety, said locking device is positioned next to the special key 2, rotation of said key 2, actuating the test device and then, by pressing again the locking device 3, rotation of the key 2 actuating the assembly of the power input 15 of the equipment where the drawer 4 of the electrical cabinet is connected.

The locking device presents a through-hole 26, which is designed to receive a safety padlock, said padlock locking the entire assembly and preventing it from being manipulated without permission.

Although detailed the invention, it is important to understand that the same does not limit its application to the details and steps described herein. The invention is capable of other embodiments and of being practiced or executed in a variety of ways. It should be understood that the terminology employed herein is for purpose of description and not of limitation.

What is claimed is:

1. A safety device for locking and actuating electrical connectors provided in an extractable drawer of an MCC cabinet, comprising:
   a power main connector and a test connector arranged in the extractable drawer, the power main connector and the test connector each having corresponding bus bars;
   a safety device assembly including:
   (i) an autonomous safety device coupled to a door of the MCC cabinet,
   (ii) a locking device located proximate the autonomous safety device,
   (iii) a gear assembly arranged in a frontal section of the extractable drawer behind the autonomous safety device, and
   (iv) at least two laminar plates connected to the power main connector and the test connector, the at least two laminar plates positioned on a base of the extractable drawer of the MCC cabinet, and including:
   a plurality of oblong cutouts configured to receive guide pins arranged in the base of the extractable drawer,
   tabs extending orthogonally from the at least two laminar plates, the tabs configured to be received by guide cutouts on the base of the extractable drawer, and
   a plurality of rectangular cutouts aligned together, on each of the at least two laminar plates that are configured to receive gear teeth of the gear assembly;
   wherein the gear assembly is connected to the at least two laminar plates;
   wherein a mechanical movement of the safety device assembly actuates the power main connector and the test connector;
   wherein the autonomous safety device is actuated by an actuation key in combination with an operation of the locking device, the gear assembly, and the at least two laminar plates, wherein the actuation key interacting with the gear assembly to facilitate the mechanical movement of the safety device assembly based on a plurality of rotational movements of the actuation key.

2. The safety device according to claim 1, wherein the test connector is actuated by a first movement of the actuation key, concomitant with the locking device being pressed.

3. The safety device according to claim 2, wherein the power main connector is actuated by a second movement of the actuation key concomitant with the locking device being pressed.

4. The safety device according to claim 1, wherein the test connector and the power main connector are actuated only in a secure environment.

5. The safety device according to claim 3, wherein the actuation of the test connector and the actuation of the power main connector occur with the door of the MCC cabinet locked in a closed position.

6. The safety device according to claim 3, wherein an unlocking of the door of the MCC cabinet occurs in response to a third movement of the actuation key.

7. The safety device according to claim 3, wherein the door of the MCC cabinet locks when the main power connector is actuated.

8. The safety device according to claim 3, wherein the actuation key is inserted to activate a test mode in order to perform at least one of accessing an interior of the extractable drawer, turning on or off an equipment connected to the MCC cabinet, and performing maintenance.

9. The safety device according to claim 3, wherein the actuation key is inserted to activate a test mode, thereby turning on a test command which can occur only when the door closed, in order to perform at least one of accessing an interior of the extractable drawer, turning on or off an equipment connected to the MCC cabinet, and performing maintenance.

10. The safety device according to claim 3, wherein the actuation of the actuation key only occurs if the test connector is connected and the door of the MCC cabinet is closed.

11. The safety device according to claim 3, wherein the door is released when the actuation key returns from an actuation position of a power socket to a test position.

12. The safety device according to claim 3, wherein a return to a disconnected position occurs by turning off the test connector, which is only possible if a power input is disconnected.

13. The safety device according to claim 1, wherein the safety device assembly further includes a frame fixed to the door or the MCC cabinet, opposite to which is positioned a drive bushing fitted axially in a body of the autonomous safety device, which provides a guide tab and, fitted in a back section of the body is positioned a coupling tab of the extractable drawer.

14. The safety device according to claim 3, wherein a reverse procedure occurs for system shutdown, when the actuation key moves in a reverse direction relative to the first movement and the second movement, respectively.

15. The safety device according to claim 1, wherein the extractable drawer is mounted inside a compartment of the MCC cabinet and an operating system of the extractable drawer is coupled to the door of the MCC cabinet, and wherein the extractable drawer is sealed and locked through a safety padlock or other equivalent locking means when the compartment is empty by the operating system.

16. The safety device according to claim 1, wherein a specific encoding is developed for different types of extractable drawers.

17. The safety device according to claim 1, wherein a working mechanism of the extractable drawer occurs through oriented gears and operates sequentially through mechanical interlocks.

18. The safety device according to claim 1, wherein:
the gear assembly is interconnected to a lock assembly, and contains internally a central pendulous element flanked by at least one gear capable of actuating a connection point for the test connector or a connection point of a power input;
the additional internal elements of the gear assembly are comprised of spring elements, wherein the gear assembly includes a housing in which the spring elements are positioned; a back face of the gear assembly presents an ergonomic section and a front face of the gear assembly presents two guide tabs parallel to each other, positioned vertically, between said tabs is an opening for a third guide tab, the third guide tab included in a back section of a body of the safety device, the back section of the body of the safety device being positioned in a back section of the locking device and fitting between the two guide tabs of the gear assembly;
the front face of the gear assembly presents a central hole, which houses a switch, wherein the actuation key contains a small salience that presses a small button coupled to the switch which when pressed by the salience in the end of the actuation key, in conjunction with the pressing of the locking device, which is positioned next to the actuation key, rotates the actuation key and then, by pressing again the locking device, rotates the actuation key actuating the power input of an equipment where the extractable drawer of the MCC cabinet is connected.

19. The safety device according to claim 1, wherein the locking device presents a hole which is a receptor of a safety padlock.

20. The safety device according to claim 3, wherein by pressing the locking device and doing the first movement of the actuation key, a first laminar plate of the at least two laminar plates, responsible for the actuation or locking of a test socket, is moved; the door of the MCC cabinet remains closed and locked, being capable of being released laterally by a second rotation of the actuation key.

21. The safety device according to claim 20, wherein by pressing the locking device, the second rotation is executed, moving a second laminar plate of the at least two laminar plates responsible for a connection or disconnection of a power socket, being that the door of the MCC cabinet is closed and locked, becoming capable of being released laterally by the actuation key.

22. The safety device according to claim 21, wherein by pressing the locking device, a second inverted rotation of the door which is closed and locked, is executed, becoming capable of being released laterally by the actuation key.

23. The safety device according to claim 22, wherein by pressing the locking device, a first inverted rotation of the door which is closed and locked, is executed, becoming capable of being released laterally by the actuation key.

24. The safety device according to claim 3, wherein:
the actuation key is actuated resulting in the door being automatically locked when a test command is connected, door of the MCC cabinet is closed, and there is no movement of a connecting cables;
the actuation key is returned to a test position when the door is closed and the power of the power input is turned off, releasing locks of both the door and the test command; and
the test command is returned to a disconnected position by turning off the test command when the power input is disconnected.

* * * * *